United States Patent
Zushi et al.

(10) Patent No.: US 9,034,466 B2
(45) Date of Patent: May 19, 2015

(54) SLIDING MEMBER

(75) Inventors: Koji Zushi, Inuyama (JP); Shigeru Inami, Inuyama (JP); Yukihiko Kagohara, Inuyama (JP)

(73) Assignee: DAIDO METAL COMPANY LTD., Aichi-Ken (JP)

( * ) Notice: Subject to any disclaimer, the term of this patent is extended or adjusted under 35 U.S.C. 154(b) by 172 days.

(21) Appl. No.: 13/809,028

(22) PCT Filed: Jul. 7, 2011

(86) PCT No.: PCT/JP2011/065592
§ 371 (c)(1),
(2), (4) Date: Jan. 8, 2013

(87) PCT Pub. No.: WO2012/005326
PCT Pub. Date: Jan. 12, 2012

(65) Prior Publication Data
US 2013/0108198 A1 May 2, 2013

(30) Foreign Application Priority Data

Jul. 9, 2010 (JP) ................ 2010-156683

(51) Int. Cl.
| B32B 9/00 | (2006.01) |
| F16C 33/04 | (2006.01) |
| C23C 14/06 | (2006.01) |
| C23C 16/26 | (2006.01) |
| F16C 33/12 | (2006.01) |
| C23C 28/04 | (2006.01) |

(52) U.S. Cl.
CPC ........... *F16C 33/043* (2013.01); *C23C 14/0605* (2013.01); *C23C 16/26* (2013.01); *F16C 33/124* (2013.01); *C23C 28/04* (2013.01); *C23C 28/046* (2013.01); *F16C 2204/10* (2013.01); *F16C 33/127* (2013.01); *F16C 2206/40* (2013.01); *F16C 2206/04* (2013.01)

(58) Field of Classification Search
CPC .... F16C 33/043; F16C 33/124; F16C 33/127; F16C 2204/10; F16C 2206/40
USPC .......................... 428/217, 325, 336, 408, 457
See application file for complete search history.

(56) References Cited

U.S. PATENT DOCUMENTS

| 5,494,760 | A | 2/1996 | Arnosti et al. | |
|---|---|---|---|---|
| 6,722,785 | B1 * | 4/2004 | Ikeo et al. | 384/112 |
| 6,740,393 | B1 * | 5/2004 | Massler et al. | 428/408 |
| 6,740,428 | B2 * | 5/2004 | Norito et al. | 384/913 |
| 6,994,474 | B2 * | 2/2006 | Kinno et al. | 384/492 |
| 2001/0021353 | A1 | 9/2001 | Sakai et al. | |
| 2004/0161625 | A1 | 8/2004 | Sakai et al. | |
| 2004/0242156 | A1 | 12/2004 | Tiirola et al. | |
| 2005/0242156 | A1 | 11/2005 | Jabs et al. | |
| 2006/0099422 | A1 * | 5/2006 | Gussone et al. | 428/408 |

FOREIGN PATENT DOCUMENTS

| EP | 0503822 | * | 9/1992 |
| JP | 59-093348 | * | 5/1984 |

(Continued)

*Primary Examiner* — Archene Turner
(74) *Attorney, Agent, or Firm* — Browdy and Neimark, PLLC

(57) ABSTRACT

Slide member is provided with an Cu-based bearing alloy layer including hard particles, and DLC layer laminated over Cu-based bearing alloy layer. At least some of the hard particles included in Cu-based bearing alloy layer are exposed on DLC layer side surface.

8 Claims, 5 Drawing Sheets

(56) References Cited

FOREIGN PATENT DOCUMENTS

| JP | 05245968 A | 9/1993 |
| JP | 2001165167 A | 6/2001 |
| JP | 2001240925 A | 9/2001 |
| JP | 2003013958 A | 1/2003 |
| JP | 2004076756 A | 3/2004 |
| JP | 2005-206867 * | 8/2005 |
| JP | 2007-031773 * | 2/2007 |
| JP | 2007534904 A | 11/2007 |

* cited by examiner

FIG. 6A

| No. | COPPER ALLOY | | | | | HP (HARD PARTICLE) | | | | HARDNESS (HV) |
|---|---|---|---|---|---|---|---|---|---|---|
| | ALLOY COMPONENT (MASS%) | | | | | COMPONENT NAME | AVERAGE PARTICLE DIAMETER (μm) | AVERAGE INTER-PARTICLE DISTANCE (μm) | AREA PERCENTAGE A (%) | |
| | Cu | Sn | Ni | Bi | | | | | | |
| EXAMPLE 1 | rem. | 6 | 3 | 5 | | Al2O3 | 2 | 4 | 12 | 98 |
| EXAMPLE 2 | rem. | 6 | 3 | 5 | | Al2O3 | 2 | 4 | 12 | 98 |
| EXAMPLE 3 | rem. | 6 | 3 | 5 | | Al2O3 | 2 | 4 | 12 | 98 |
| EXAMPLE 4 | rem. | 6 | 3 | 5 | | Mo2C | 2 | 4 | 12 | 98 |
| EXAMPLE 5 | rem. | 6 | 3 | 5 | | TiSi2 | 3 | 4 | 14 | 100 |
| EXAMPLE 6 | rem. | 6 | 3 | 5 | | Mo2C | 1 | 3 | 12 | 97 |
| EXAMPLE 7 | rem. | 6 | 3 | 5 | | Mo2C | 20 | 80 | 0.08 | 90 |
| EXAMPLE 8 | rem. | 6 | 3 | 5 | | TiSi2 | 0.5 | 4 | 11 | 95 |
| EXAMPLE 9 | rem. | 6 | 3 | 5 | | TiSi2 | 25 | 90 | 0.07 | 90 |
| EXAMPLE 10 | rem. | 6 | 3 | 5 | | Mo2C | 2 | 5 | 11 | 98 |
| EXAMPLE 11 | rem. | 6 | 3 | 5 | | Mo2C | 2 | 50 | 0.09 | 90 |
| EXAMPLE 12 | rem. | 6 | 3 | 5 | | Mo2C | 2 | 4 | 12 | 98 |
| EXAMPLE 13 | rem. | 6 | 3 | 5 | | Mo2C | 2 | 55 | 0.09 | 90 |
| EXAMPLE 14 | rem. | 6 | 3 | 5 | | Mo2C | 1 | 40 | 0.1 | 90 |
| EXAMPLE 15 | rem. | 6 | 3 | 5 | | Mo2C | 20 | 20 | 10 | 100 |
| EXAMPLE 16 | rem. | 6 | 3 | 5 | | Mo2C | 2 | 50 | 0.05 | 90 |
| EXAMPLE 17 | rem. | 6 | 3 | 5 | | Mo2C | 2 | 5 | 11 | 98 |
| EXAMPLE 18 | rem. | 6 | 3 | 5 | | Mo2C | 2 | 9 | 3 | 92 |
| EXAMPLE 19 | rem. | 6 | 3 | 5 | | Mo2C | 2 | 5 | 11 | 92 |
| EXAMPLE 20 | rem. | 6 | 3 | 5 | | Mo2C | 2 | 5 | 11 | 92 |
| EXAMPLE 21 | rem. | 6 | 3 | 5 | | Mo2C | 2 | 4 | 12 | 98 |
| EXAMPLE 22 | rem. | 6 | 3 | 5 | | Mo2C | 2 | 9 | 3 | 90 |
| EXAMPLE 23 | rem. | 6 | 3 | 5 | | Mo2C | 2 | 5 | 11 | 98 |
| EXAMPLE 24 | rem. | 6 | 3 | 5 | | Mo2C | 20 | 20 | 10 | 100 |
| COMPARATIVE EXAMPLE 1 | rem. | 6 | 3 | 5 | | — | — | — | — | 90 |
| COMPARATIVE EXAMPLE 2 | rem. | 6 | 3 | 5 | | Al2O3 | 2 | 4 | 12 | 98 |

| No. | DLC HARDNESS (HV) | DLC THICKNESS (μm) | H*T | A/T | HARDNESS (HV) OF COUNTER ELEMENT | FORMATION SPEED OF DLC LAYER | PERFORMANCE DELAMINATION LOAD (N) | PERFORMANCE SEIZURING SPECIFIC LOAD (MPa) |
|---|---|---|---|---|---|---|---|---|
| EXAMPLE 1 | 4000 | 2 | 8000 | 6.0 | 600 | 1 | 110 | 19 |
| EXAMPLE 2 | 4000 | 2 | 8000 | 6.0 | 600 | 2 | 110 | 20 |
| EXAMPLE 3 | 4000 | 2 | 8000 | 6.0 | 600 | 3 | 110 | 19 |
| EXAMPLE 4 | 4000 | 2 | 8000 | 6.0 | 600 | 2 | 280 | 26 |
| EXAMPLE 5 | 4000 | 2 | 8000 | 7.0 | 600 | 2 | 300 | 25 |
| EXAMPLE 6 | 4000 | 2 | 8000 | 6.0 | 600 | 2 | 270 | 27 |
| EXAMPLE 7 | 4000 | 2 | 8000 | 0.04 | 600 | 2 | 170 | 26 |
| EXAMPLE 8 | 4000 | 2 | 8000 | 5.5 | 600 | 2 | 270 | 25 |
| EXAMPLE 9 | 4000 | 2 | 8000 | 0.04 | 600 | 2 | 60 | 23 |
| EXAMPLE 10 | 4000 | 2 | 8000 | 5.5 | 600 | 2 | 280 | 36 |
| EXAMPLE 11 | 4000 | 2 | 8000 | 0.05 | 600 | 2 | 200 | 33 |
| EXAMPLE 12 | 4000 | 2 | 8000 | 6.0 | 600 | 2 | 280 | 32 |
| EXAMPLE 13 | 4000 | 2 | 8000 | 0.05 | 600 | 2 | 180 | 30 |
| EXAMPLE 14 | 4000 | 2 | 8000 | 0.05 | 600 | 2 | 200 | 40 |
| EXAMPLE 15 | 4000 | 2 | 8000 | 5.0 | 600 | 2 | 270 | 41 |
| EXAMPLE 16 | 4000 | 2 | 8000 | 0.03 | 600 | 2 | 180 | 37 |
| EXAMPLE 17 | 4000 | 2 | 8000 | 5.5 | 600 | 2 | 280 | 36 |
| EXAMPLE 18 | 6000 | 1.6 | 9600 | 1.5 | 600 | 2 | 250 | 46 |
| EXAMPLE 19 | 650 | 15 | 9750 | 0.7 | 600 | 2 | 250 | 47 |
| EXAMPLE 20 | 500 | 10 | 5000 | 1.1 | 600 | 2 | 250 | 50 |
| EXAMPLE 21 | 4000 | 1 | 4000 | 12.0 | 500 | 2 | 280 | 35 |
| EXAMPLE 22 | 110 | 5 | 550 | 0.6 | 600 | 2 | 250 | 37 |
| EXAMPLE 23 | 500 | 3 | 1500 | 3.7 | 700 | 2 | 280 | 42 |
| EXAMPLE 24 | 1000 | 2 | 2000 | 5.0 | 2000 | 2 | 270 | 48 |
| COMPARATIVE EXAMPLE 1 | 4000 | 2 | 8000 | - | 600 | 2 | 100 | 11 |
| COMPARATIVE EXAMPLE 2 | - | - | - | - | 600 | - | - | 9 |

FIG. 6B

SLIDING MEMBER

TECHNICAL FIELD

The present invention relates to a slide member provided with a diamond-like carbon layer over a bearing alloy layer.

BACKGROUND

A slide member such as a slide bearing provided with a bearing alloy layer comprising Al alloy or Cu alloy exhibits relatively good initial conformability and outstanding fatigue resistance and wear resistance. Such slide member is employed in bearings for high output engines used, for instance, in automobile and industrial machines in general. A slide member with further improved bearing properties is desired with improvement in engine performance.

A slide member with improved bearing properties, namely conformability and wear resistance is disclosed in JP 2001-165167 A. The disclosed slide member has a bearing alloy layer comprising Al alloy or Cu alloy which has annular protrusions formed on it. The slide member further has a diamond-like carbon layer on the surface of the annular protrusions. The document teaches that the conformability of the disclosed, slide member is improved because the annular protrusions are plastic deformation prone when subjected to the load, applied, by the counter element. The document further teaches that the disclosed slide member exhibits good wear resistance because of the diamond like carbon layer provided, on the surface of the bearing alloy layer.

In addition to improvement in conformability and wear resistance, reduced friction coefficient is emerging as a further desired improvement in bearing properties.

SUMMARY OF THE INVENTION

Problems to be Overcome

The present invention is based on the above described background and one object of the present invention is to provide a slide member with reduced fiction coefficient.

Means to Overcome the Problem

In one embodiment of the present invention, a slide member includes a Cu-based bearing alloy layer including hard particles; and a DLC layer laminated over the Cu-based bearing alloy layer; wherein at least some of the hard particles included in the Cu-based bearing alloy layer are exposed on a DLC layer side surface.

The Cu-based bearing alloy layer is Cu based, and includes hard, particles and other components as required. Some of the hard particles within the Cu-based bearing alloy layer are exposed, on the DLC (Diamond-Like Carbon) surface side. It is to be appreciated that the hard particles exposed to the surface in the DLC layer side indicate hard particles that are not covered by the Cu matrix. Thus, the hard particles exposed on the DLC layer side surface include hard particles that protrude toward the DLC layer side from the DLC layer side surface of the Cu-based bearing alloy layer. The hard particles exposed on the DLC layer side can be obtained through adjustments in the percentage (weight %) of the hard particles contained in the Cu-based bearing alloy layer and the particle diameter of the hard particles.

The Cu-based bearing alloy layer may be provided over a metal backing made, for instance, of iron. Further, a bonding layer may be provided between the metal backing and the Cu-based bearing alloy layer to improve the bondability of the metal backing and the Cu-based bearing alloy layer. The bonding layer, in this case, preferably comprises a Cu plating layer.

In the present embodiment, the hard particles comprises at least one type of compound selected from a group consisting of boride, silicide, oxide, nitride, carbide, and intermetallic compound, and the particle diameter of the hard particle averages from 0.5 to 20 (μm).

A boride preferably comprises NiB, $Ni_3B$, CrB, $ZrB_2$, CoB, $TiB_2$, $VB_2$, $TaB_2$, WB, MoB, Fe—B system or the like. A silicide preferably comprises $TiSi_2$, $WSi_2$, $MoSi_2$, $TaSi_2$, $CrSi_2$, Fe—Si system, Mn—Si system, or the like. An oxide preferably comprises $SiO_2$, $Al_2O_3$, $TiO_2$, $ZrO_2$, WO, $MoO_3$, Mn—O system, Fe—O system, V—O system, or the like. A nitride preferably comprises, $Si_2N_4$, TiN, ZrN, TaN, VN, AlN, C—BN, $Cr_2N$, or the like. A carbide preferably comprises WC, $W_2C$, SiC, $B_4C$, TiC, TaC, VC, ZrC, $Mo_2C$ or the like. An intermetallic compound preferably comprises Ni—Sn system, Fe—W system, Fe—Mo system, Fe—Mn system, Fe—Cr system, Fe—Al system, Cr—Al system, V—Al system, Ti—Al system, W—Al system, or the like.

Hard particles may further comprise other types of materials such as Ni-based autogenous alloy (Ni—B—Si system), Co-based autogenous alloy (Co—Mo—Si—B system), C, W or Mo.

Further, the hard particles comprising metal silicide and metal carbide is particularly preferable.

Arranging the average particle diameter of the hard particles to 0.5 (μm) or greater facilitates exposure of the hard particles on the DLC layer side surface of the Cu-based bearing alloy layer. Arranging the average particle diameter of the hard particles to 20 (μm) or less facilitates dispersion of the hard particles within the Cu-based bearing alloy layer. Thus, the average particle diameter of the hard particles is configured to range from 0.5 to 20 (μm). Thus, relatively greater amount of the hard particles are allowed to be exposed on the DLC layer side surface of the Cu-based bearing alloy layer even when the percentage in the amount of the hard particles within the Cu-based bearing alloy layer is relatively less. The average particle diameter preferably ranges between 1 to 10 (μm). In the present, embodiment, the average particle diameter of the hard particles is measured, for instance, by fischer method.

Ready-made hard particles available in the market may be employed in which the particle diameter is pre-arranged.

The primary component of the DLC layer is an amorphous material comprising hydrogen carbide or an allotrope of carbon. The DLC layer is formed over the Cu-based bearing alloy layer by plasma enhanced chemical vapor deposition (CVD), physical vapor deposition (PVD), or the like.

In the present embodiment, the DLC layer slides with respect to the counter element on the surface in the opposite side of the Cu-based bearing alloy layer, Hereinafter, the surface of the DLC layer in the opposite side of the Cu-based bearing alloy layer that slides with respect to the counter element is referred to as "the slide surface of the DLC layer".

The shape of the sliding surface of the DLC layer is controlled by controlling the speed of the DLC layer formation or controlling the distribution of the hard particles residing on the DLC layer side surface of the Cu-based bearing alloy layer.

The DLC layer grows in the direction of its thickness from the hard particles exposed on the DLC layer side surface of the Cu-based bearing alloy layer. Thus, the DLC layer grown from the hard, particles exposed on the DLC layer side surface of the Cu-based bearing alloy layer reflects the planar shape of the exposed hard particles. That is, portions of the slide layer of the DLC layer that correspond to the hard particles exposed from, the Cu-based bearing alloy layer results in a protrusion which is protrusive as compared to other portions. Carbon constituting the DLC layer forms a stronger bond with the hard particles comprising group of elements similar to carbon such as borides, silicides, oxides, nitrides, carbides, and intermetallic compounds, as compared to Cu which is the primary component of the Cu-based bearing alloy layer. Carbon constituting the DLC layer especially exhibits high bonding force with hard particles comprising carbides and silicides that include congeners such as carbon and silicon. Thus, the hard, particles exposed from the Cu-based bearing alloy layer serves as a medium to establish a stronger bond between the DLC layer and the Cu-based bearing alloy layer. Further, the amount of protrusion observed on the slide surface of the DLC layer increases with the increase in the amount of protrusion of the hard particles protruding toward the DLC layer side from the Cu-based bearing alloy layer.

The protrusions formed on the slide surface of the DLC layer, so as to correspond to the planar shapes of the hard particles, are prone to receive load from the counter element. Thus, frictional heat easily develops on the protrusions when the protrusions formed on the slide surface of the DLC layer is in sliding contact with the counter element. The frictional heat facilitates graphitization of the protrusions formed on the slide surface of the DLC layer and thus, the softening of the protrusions, thereby reducing the resistance to shearing force. Hence, shearing force applied to the DLC layer, when sliding with the counter element, renders the DLC layer slippery which means that the frictional coefficient of the DLC layer is reduced.

The protrusions reflecting the planar shapes of the hard particles are formed on the slide surface of the DLC layer when the DLC layer is formed at a certain speed which is hereinafter referred to as a first, formation speed.

The slide surface of the DLC layer can be shaped relatively flat, by controlling the formation speed of the DLC layer or controlling the distribution of the hard particles exposed from the Cu-based bearing alloy layer. The slide surface of the DLC layer, when formed relatively flat, allows the load of the counter element to be distributed throughout the slide surface of the DLC layer. The DLC layer and the hard particles are harder than Al that serves as the matrix of the Cu-based bearing alloy layer. Therefore, the DLC layer formed on the hard particles exposed from the Cu-based bearing alloy layer do not easily deform when load is applied to the slide surface of the DLC layer.

In contrast, the DLC layer which is formed on Cu serving as the matrix of the Cu-based bearing alloy layer where the hard particles are not exposed, deforms easily toward the Cu-based bearing alloy layer with the deformation of Cu when load is applied from the sliding surface side of the DLC layer.

As a result, the load applied by the counter element is prone to concentrate on the DLC layer located on the exposed hard particles even when the load is evenly distributed throughout the sliding surface of the flat DLC layer. Further, because the DLC layer formed, on the hard particles exposed from the Cu-based bearing alloy layer and the counter element are prone to come in sliding contact, frictional heat readily develops at the contact site. The frictional heat facilitates graphitization and thus, the softening of the DLC layer formed, on the hard, particles, thereby reducing the resistance to shearing force. Hence, shearing force applied, to the DLC layer, when sliding with the counter element, renders the DLC layer slippery, which means that the frictional coefficient of the DLC layer is reduced.

The slide surface of the DLC layer becomes relatively flat when the DLC layer is formed at a certain speed which is hereinafter referred to as a second formation speed.

Further, as shown in FIG. 5, the DLC layer formed on the hard particles exposed from the Cu-based bearing alloy layer can be made thinner than the DLC layer formed at the second formation speed by controlling the formation speed of the DLC layer or controlling the distribution of the hard particles exposed from the Cu-based bearing alloy layer. As a result, the DLC layer formed on the hard particles exposed from the Cu-based bearing alloy layer can be made thinner than other portions of the DLC layer. This results in formation of recesses in the portions of the slide surface of the DLC layer corresponding to the exposed hard particles. Lubricating oil for lubricating the slide portion fills the recess thus formed. This facilitates the lubrication between the slide member and the counter element and renders the slide member less friction prone. As a result, the requirement for improvement in seizure resistance can also be achieved.

The slide surface of the DLC layer can be recessed by forming the DLC layer at a certain speed referred to as a third formation speed.

In the slide member of one embodiment of the present invention, the hard particles exposed on the DLC layer side surface are spaced from one another by an average distance ranging from 3 to 50 ($\mu$m).

Arranging the average distance between the exposed hard, particles to 50 ($\mu$m) or less suppresses sparse distribution of the hard particles exposed on the DLC layer side surface of the Cu-based bearing alloy layer. Thus, it becomes easier for the Cu-based bearing alloy layer and the DLC layer to exert high bonding force therebetween. This results in improved seizure resistance. Arranging the average distance between the exposed hard particles to 3 ($\mu$m) or greater, renders the count of protrusions formed on the slide surface of the DLC layer and the size of the recesses formed on the slide surface more suitable in terms of oil film formation. This suppresses oil film ruptures and provides outstanding seizure resistance. Controlling the average distance between the hard particles secures the bonding force between the Cu-based bearing alloy layer and the DLC layer of the Cu-based bearing alloy layer as well as the seizure resistance. The average distance preferably ranges from 5 to 45 ($\mu$m).

In the slide member of one embodiment of the present invention, the area percentage of the hard, particles exposed on the DLC layer side surface with respect to a total area of the DLC layer side surface ranges from 0.1 to 14(%).

The total area of hard particles corresponds to the projection area of hard, particles exposed on the DLC layer side surface of the Cu-based bearing alloy layer, in other words, the sum of the area which is occupied by the planar shape of the hard particles. Thus, the area percentage is the percentage the total area of the exposed hard particles occupies within the total area of the DLC layer side surface of the Cu-based bearing alloy layer. Further, the area percentage of the hard particles mentioned in this specification indicates the sum of the projection area of every hard particle residing on the unit area of the DLC layer side surface of the Cu-based bearing alloy layer.

When the area percentage of the hard particles is 0.1(%) or greater, the hard particles increases their contribution to the formation of the DLC layer. Thus, it becomes easier to form protrusions and recesses on the slide surface of the DLC layer through control of the formation speed of the DLC layer.

Further, when the area percentage is 0.1(%) or greater, the area of contact between the DLC layer and the hard particles is secured reliably to allow relatively greater bonding force to be exerted between the Cu-based bearing alloy layer and the DLC layer. By controlling the area percentage as described above, delamination of the DLC layer is suppressed more reliably to thereby improve the seizure resistance. As opposed to this, when the area percentage is 14(%) or less, it becomes easier to prevent oversizing of protrusions and recesses in the slide layer of the DLC layer regardless of the formation speed of the DLC layer. Thus, arranging the area percentage to 14(%) or less is advantageous in terms of oil film formation. It is further preferable to arrange the area percentage to 14(%) or less in terms of wear resistance. Due to the above described reasons, the wear resistance and the seizure resistance can be improved by controlling the area percentage. The preferable range of the area percentage is 2 to 10%.

The total area of the hard particles exposed on the DLC layer side surface of the Cu-based bearing alloy layer can be controlled by modifying the particle diameter of the hard particles.

The analysis on the area percentage of the hard particles is done by capturing images of the DLC layer side surface of the Cu-based bearing alloy layer with a microscope and putting the captured images through an image analysis equipment. In doing so, every hard particle residing within the observation field of, for instance, 0.0125 mm$^2$ is extracted and the area is calculated for each of the extracted hard particles. The area percentage is calculated based on the ratio of the area of the observation field to the sum of the area of the hard particles. The area percentage that the total area of the hard particles residing within the observation field occupies within the area of the observation field is equal to the area percentage that the total area of the hard particles exposed on the DLC layer side surface of the Cu-based bearing alloy layer occupies within the area of the DLC layer side surface of the Cu-based bearing alloy layer. The area percentage may be configured to vary in certain locations depending upon usage.

In obtaining the particle diameter of the hard particles exposed on the DLC layer side surface of the Cu-based bearing alloy layer, the area of each hard particle residing within the 0.0125 mm$^2$ observation field is measured. Then, an imaginary circle is drawn which has an area identical to the measured area of the hard particle and the diameter of the imaginary circle is converted into the particle diameter.

In the slide member of one embodiment of the present invention, $A \geq 0.5 \times T$, where A (%) represents the area percentage of the hard particles exposed on the DLC layer side surface and T (μm) represents the thickness of the DLC layer.

Area percentage A (%) of the hard particles and thickness T (μm) of the DLC layer affect the friction produced in the sliding movement. More specifically, it becomes easier to cause shear slips within the DLC layer when a DLC layer, having a certain hard particle area percentage, becomes thinner or when the area percentage of the hard particles becomes greater in a DLC layer having a certain thickness, thereby facilitating the reduction of the friction coefficient. Area percentage A (%) of the hard particles exposed on the DLC layer side surface and thickness T (μm) of the DLC layer are interrelated in the above described manner.

In the slide member of one embodiment of the present invention, $H \leq 10000/T$, where H(HV) represents the hardness of the DLC layer and T (μm) represents the thickness of the DLC layer.

The influence of the hard particles in causing the above described difference in the hardness of the DLC layer becomes greater when $H \leq 10000/T$, where H (HV) represents the hardness of the DLC layer and T (μm) represents the thickness of the DLC layer. When the hardness relative to the thickness of the DLC layer is controlled within the above range, it becomes easier to effectively facilitate the graphitization of the exceptionally wear resistant slide surface of the DLC layer based on the presence/absence of the hard, particles. The controlled correlation between the hardness and the thickness of the DLC layer achieves both reduction in friction coefficient and improvement in wear resistance.

In the slide member of one embodiment of the present invention, the DLC layer satisfies $H \leq 6000$, and $T \leq 15$. This means that hardness H of the DLC layer is $H \leq 6000$ (HV) and thickness T of the DLC layer is $T \leq 15$ (μm).

When the thickness of the DLC layer is equal to or less than 15 (μm), it becomes easier to form, on the slide surface of the DLC layer, convexes and concaves that reflect the hard particles exposed from the Cu-based bearing alloy layer. The above described thickness of the DLC layer is obtained by controlling the duration of methodologies such as plasma enhanced CVD and PVD employed in forming the DLC layer.

Further, when hardness H of the DLC layer is equal to or less than 6000 (HV), the aggression of the DLC layer on the counter element can be readily suppressed while achieving sufficient wear resistance. The hardness of the DLC layer may be modified through adjustments in the content of additive elements such as hydrogen, Si, Ti, and W in the DLC layer and the ratio of hybrid orbital ($sp^2/sp^3$) in the DLC layer.

In the slide member of one embodiment of the present invention, the hardness of the DLC layer is 1.1 times or greater the hardness of the Cu-based bearing alloy layer and 0.9 times or less the hardness of the counter element with which the DLC layer slides.

When the hardness of the DLC layer is 1.1 times or greater the hardness of the Cu-based bearing alloy layer, the DLC layer exerts its wear resistance more effectively. On the other hand, when the hardness of the DLC layer is 0.9 times or less the hardness of the counter element with which it slides, the wear of the counter element can be suppressed more reliably. Thus, specifying the hardness of the DLC layer in the above described manner reduces the wear of both the DLC layer and the counter element.

Between the Cu-based bearing alloy layer and the DLC layer, an intermediate layer may be provided to improve the bonding between them. The intermediate layer preferably comprises metal such as Si, Ti, Cr, and W or carbides and nitrides. The intermediate layer may vary its composition in the thickness direction. For instance, When the intermediate layer is a Si—C system or a Ti—C system, the concentration of Si or Ti may be arranged to be relatively higher in the Cu-based bearing alloy layer side, whereas the concentration of C may be arranged to be relatively higher in the DLC layer side.

BRIEF DESCRIPTION OF THE DRAWINGS

FIG. 6A and 6B A chart specifying EXAMPLES and COMPARATIVE EXAMPLES of a slide member of one embodiment.

EMBODIMENTS OF THE INVENTION

Figure 1:
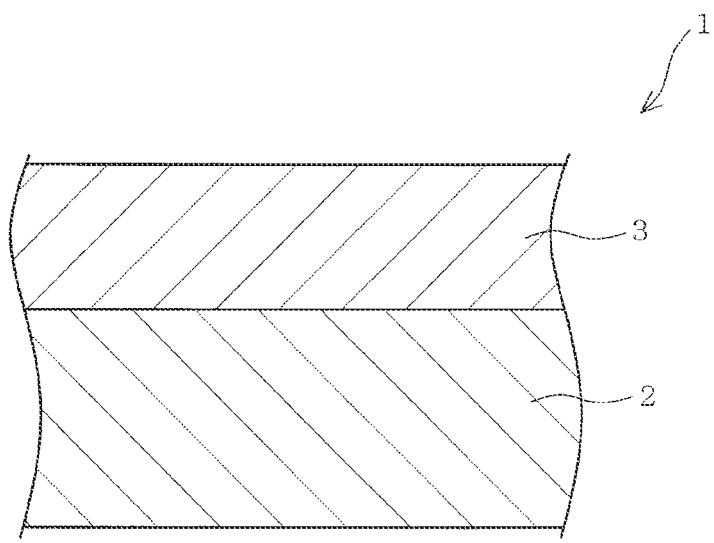
FIG. 1 A cross sectional view schematically indicating a slide member of one embodiment of the present invention.
Figure 2:
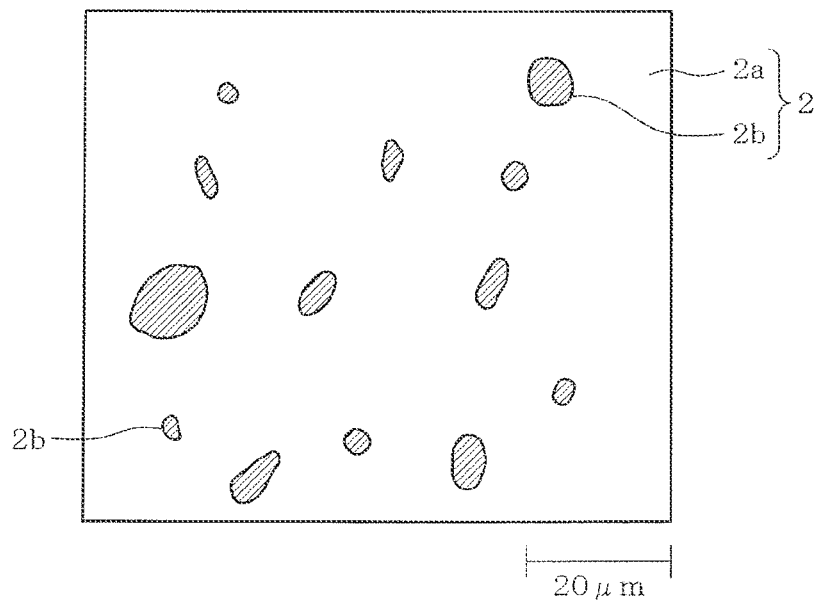
FIG. 2 A transverse plan view schematically indicating a slide surface of an Cu-based bearing alloy layer of a slide member of one embodiment.

The slide member of the present embodiment is illustrated in FIG. 1. Slide member 1 shown in FIG. 1 is provided with Cu-based bearing alloy layer 2 and DLC layer 3. Cu-based bearing alloy layer 2 is provided over a metal backing not shown. DLC layer 3 is provided over Cu-based bearing alloy layer 2. As shown in FIG. 2, Cu-based bearing alloy layer 2 comprises Cu matrix $2a$ and hard particles $2b$. In other words, Cu-based bearing alloy layer 2 contains hard particles $2b$ within Cu matrix $2a$. Hard particles $2b$ contained in Cu-based bearing alloy layer 2 are at least partially exposed on DLC layer 3 side surface of Cu-based bearing alloy layer 2. Being "exposed" in this context indicates either the state in which hard particles $2b$ are located on a plane coincidental with DLC layer 3 side surface of Cu-based bearing alloy layer 2 or the state in which hard particles $2b$ protrude toward DLC layer 3 from the surface.

Figure 3:
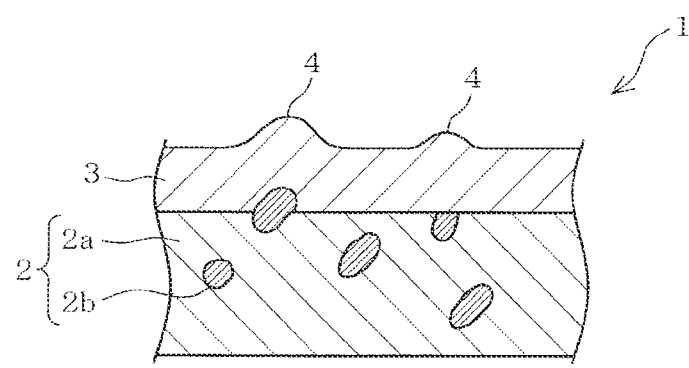
FIG. 3 A cross sectional view schematically indicating a slide member in which a DLC layer is formed at a first formation speed.

When DLC layer 3 is formed at the first formation speed, DLC layer 3 is shaped as shown in FIG. 3. That is, the slide surface of DLC layer 3 forms protrusions 4 reflecting the shapes of hard, particles $2b$ exposed on DLC layer 3 side surface of Cu-based bearing alloy layer 2.

Figure 4:
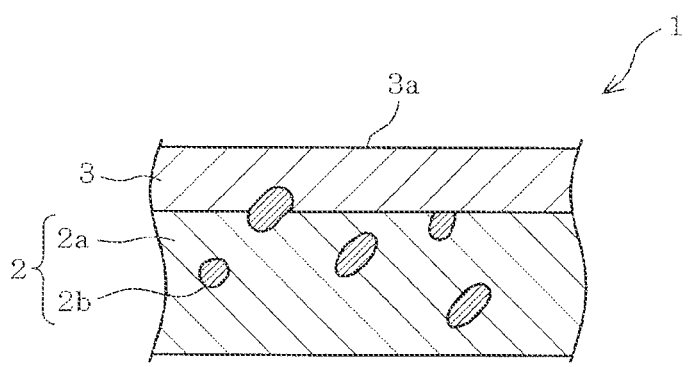
FIG. 4 A cross sectional view schematically indicating a slide member in which the DLC layer is formed at a second formation speed.

When DLC layer 3 is formed at the second formation speed, DLC layer 3 is shaped as shown in FIG. 4. That is, the slide surface of DLC layer 3 forms planar surface $3a$ regardless of the shapes of hard particles $2b$ exposed, on DLC layer 3 side surface of Cu-based bearing alloy layer 2.

Figure 5:
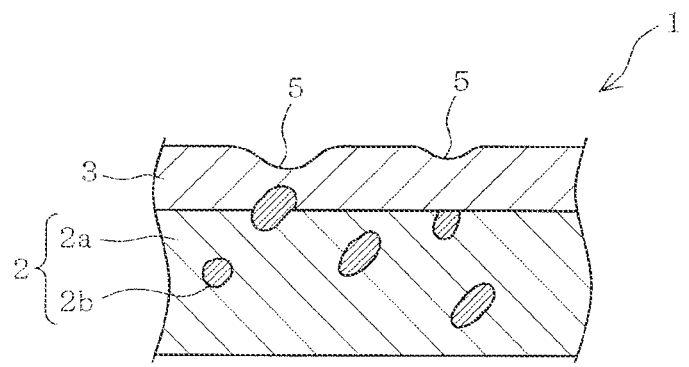
FIG. 5 A cross sectional view schematically indicating a slide member in which the DLC layer is formed at a third formation speed.

When DLC layer 3 is formed at the third formation speed, DLC layer 3 is shaped, as shown in FIG. 5. That is, the slide surface of DLC layer 3 forms recesses 5 reflecting the shapes of hard particles $2b$ exposed on the DLC layer 3 side surface of Cu-based bearing alloy layer 2.

Next, a description is given on a method of manufacturing a slide member of the present embodiment.

First, Cu powder is mixed with hard particles having the particle diameter being prearranged to a predetermined size and with other powder components at a predetermined mass percentage. In the present embodiment, hard particles comprise $Mo_2C$. The Cu powder may be replaced by Cu alloy powder comprising Cu—Sn—Ni alloy and Cu—Sn—Ni—Zn alloy. Further, 2 or more types of hard particles may be mixed.

Next, the power mixture of Cu powder and hard particles is dispersed on a strip of steel sheet which is 1.3 mm thick. The strip of steel sheet corresponds to a metal backing and has a Cu plating provided on it in advance. Next, the powder-dispersed steel sheet is heated for approximately 15 minutes in a reducing atmosphere of 800 to 950° C. The powder-dispersed steel sheet is subjected to initial sintering to form a Cu-based bearing alloy layer with the Cu powder and hard particles. Then, the steel sheet having the Cu-based bearing alloy layer formed on it is repeatedly rolled, and sintered for densification. This forms the steel sheet having the Cu-based bearing alloy layer formed on it into a bimetal which is approximately 1.6 mm thick and in which the Cu-based bearing alloy layer is approximately 0.4 mm thick. The obtained bimetal was formed into a semi cylindrical shape.

The bimetal formed into a semi cylindrical shape further forms a DLC layer thereon by treating its inner peripheral surface with an ordinary plasma enhanced CVD or PVD.

Samples of a slide member were fabricated in the above described manner and verified for their friction coefficient.

More specifically, EXAMPLES obtained by the manufacturing method of the present embodiment may form the DLC layer at various controlled speeds. When the DLC layer is formed at the first formation speed, protrusions can be formed on the sliding surfaces of the DLC layer. When the DLC layer is formed at the second formation speed, a relatively flat slide surface can be obtained. When the DLC layer is formed at the third formation speed, recesses can be formed on the sliding surface of the DLC layer. Among EXAMPLES indicated in FIG. 6, EXAMPLE 1 forms the DLC layer at the first formation speed as shown in FIG. 3. EXAMPLE 2 forms the DLC layer at the second formation speed as shown in FIG. 4. EXAMPLE 3 forms the DLC layer at the third formation speed as shown in FIG. 5. Further, EXAMPLES 4 to 24 and COMPARATIVE EXAMPLE 1 each forms the DLC layer at the second formation speed. COMPARATIVE EXAMPLE 1 used for comparison in the verification does not contain Si in the Cu-based bearing alloy layer. COMPARATIVE EXAMPLE 2 is not provided, with a DLC layer. Description will be given hereinafter on EXAMPLES and COMPARATIVE EXAMPLES based on FIG. 6.

(Regarding Cu-Based Bearing Alloy Layer)

The Cu-based bearing alloy layer of EXAMPLES 1 to 24, and COMPARATIVE EXAMPLE 1 and 2 are each formed of Cu-based Cu alloy including 6 mass (%) of Sn, 3 mass (%) of Ni, and 5 mass(%) of Bi.

(Regarding Component of Hard Particles)

In EXAMPLES 1 to 3 and COMPARATIVE EXAMPLE 2, the hard particles comprise $Al_2O_3$. In EXAMPLES 4, 6, 7, and 10 to 24, the hard particles comprise $Mo_2C$. In EXAMPLES 5, 8, and 9, the hard particles comprise $TiSi_2$. Stated differently, with the exception of EXAMPLES 1 to 3 and COMPARATIVE EXAMPLE 2, the hard particles of EXAMPLES comprise silicides of metal or carbides of metal.

(Regarding Average Particle Diameter of Hard Particles)

In EXAMPLES 1 to 8, 10 to 24, and COMPARATIVE EXAMPLE 2, the average particle diameter of the hard particles exposed on the DLC layer side of the Cu-based bearing alloy layer ranges from 0.5 to 20 (μm). In EXAMPLE 9, the average particle diameter of the hard particles is configured to 25 (μm).

(Regarding Average Distance Between Hard Particles)

In EXAMPLES 1 to 6, 8, 10 to 12, and 14 to 24, the average distance between the hard particles exposed on the DLC layer side surface of the Cu-based bearing alloy layer ranges from 3 to 50 (μm). As opposed to this, in EXAMPLE 7, the average distance between the hard, particles is configured to 80 (μm); in EXAMPLE 9, the average distance between the hard, particles is configured to 90 (μm); and in EXAMPLE 13, the average distance between the hard particles is configured to 55 (μm).

(Regarding Area Percentage of Hard Particles)

In EXAMPLES 1 to 6, 8, 10, 12, 14, 15, and 17 to 24, the area percentage of the hard, particles ranges from 0.1 to 14(%). As opposed to this, in EXAMPLE 7, the area percentage of the hard, particles is configured to 0.08(%); in EXAMPLE 9, the area percentage of the hard particles is configured to 0.07(%); in EXAMPLES 11 and 13, the area percentage of the hard particles is configured to 0.09(%); and in EXAMPLE 16, the area percentage of the hard particles is configured to 0.05(%). The area percentage of the hard particles in the foregoing EXAMPLES is less than 0.1(%).

(Regarding Relation Between Hardness and Thickness of DLC Layer)

Figure 7:
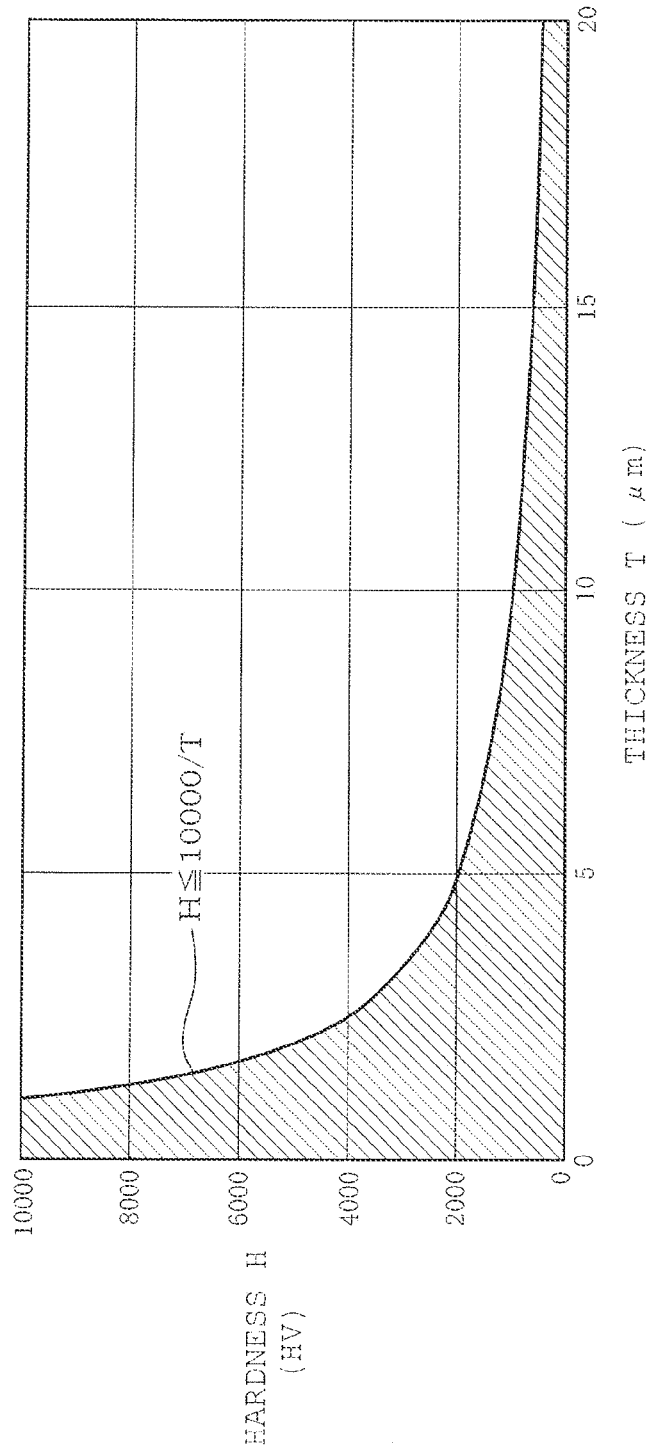
FIG. 7 A chart indicating the relation between the hardness and the thickness of the DLC layer.

In EXAMPLES 1 to 24, the relation between hardness (H) and thickness (T) of DLC all satisfy H≤10000/T. Hardness H and thickness T of the DLC layer relate to one another as shown in FIG. 7. EXAMPLES 1 to 24 are plotted in the shaded region located closer to the origin from the curve derived from H≤10000/T.

(Relation Between Area Percentage of Hard Particles And thickness of DLC Layer)

In EXAMPLES 1 to 6, 8, 10, 12, 15, and 17 to 24, area percentage A (%) of the hard particles exposed on the DLC layer side surface of the Cu-based bearing alloy layer and thickness T of the DLC layer satisfy A≥0.5×T. In contrast, A≤0.5×T in EXAMPLES 7, 9, 11, 13, 14, and 16.

(Regarding Adhesion Test)

EXAMPLES 1 to 24 and COMPARATIVE EXAMPLE 1 in FIG. 6 were tested for the adhesion of the Cu-based bearing alloy layer and the DLC layer. The adhesion of the DLC layer was tested by peeling the DLC layer through application of delamination load. More specifically, the DLC layer is subjected to continuous delamination load ranging from 0 (N) to 300 (N). The distance of movement during the application of the delamination load is configured to 10 (mm). The lamination load is given by a spherical element and is made of chrome steel (SUJ-2) which is 3 (mm) in diameter. Further, when applying the delamination load, 10 (μ liters) of lubricant was supplied between the slide member and the spherical element.

The delamination load in which delamination was observed in the DLC layer of each sample is as indicated in FIG. 6. The results snow that the delamination load in EXAMPLES 1 to 24 were equal to or greater than 110 (N). In contrast, COMPARATIVE EXAMPLE 1 exhibit a delamination load of 100 (N). It can be understood from above that in EXAMPLES 1 to 24 of the present embodiment in which the hard particles are exposed on the DLC layer side surface of the Cu-based bearing alloy layer, the DLC layer is highly adhesive compared to COMPARATIVE EXAMPLES 1 and 2 that do not contain hard particles. In other words, it is clear that the hard particles exposed on the DLC layer side surface of the Cu-based bearing alloy layer is a contributing factor in improving the bonding between the DLC layer and the Cu-based bearing alloy layer.

With reference to EXAMPLES 2, 4, and 5, verification is made on how the components of the hard particles affect the delamination load. Referring to FIG. 6, EXAMPLE 4 in which hard particles comprises $Mo_2C$ which is a metal carbide and EXAMPLE 5 in which hard particles comprise $TiSi_2$ which is a metal silicide show improved delamination load as compared to EXAMPLE 1 in which hard, particles comprise $Al_2O_3$ which is a metal oxide. This is an indication that, hard particles, when made of a metal carbide or a metal, silicide, increases its contribution to the bonding of the Cu-based bearing alloy layer and the DLC layer.

The above described results indicate that the delamination load, in other words, the contribution of the hard particles to the bonding of the Cu-based bearing alloy layer and the DLC layer is increased when the average particle diameter of the hard particles is 20 (μm) or less. For example, in comparison with EXAMPLE 9 in which the average particle diameter of the hard particles exceeds 20 (μm), the delaimination load is improved in other EXAMPLES having approximating conditions. This is an indication that the average particle diameter of the hard particles exposed on the DLC layer side surface of Cu-based bearing alloy layer is preferably 20 (μm) or less.

The above described results further indicate that the contribution of the hard particles to the bonding of the Cu-based bearing alloy layer and the DLC layer is increased when the average distance between the hard particles is 50 (μm) or less. For example, in comparison with EXAMPLES 7, 9, and 13 in which the average distance between the hard particles exceeds 50 (μm), the delaimination load is improved in other EXAMPLES having approximating conditions. This is an indication that the average distance between the hard particles exposed on the DLC layer side surface of the Cu-based bearing alloy layer is preferably 50 (μm) or less.

The above described results further indicate that the contribution of the hard particles to the bonding of the Cu-based bearing alloy layer and the DLC layer is increased when the area percentage A of the hard particles is 0.1(%) or greater. For example, in comparison with EXAMPLES 7, 9, 11, 13, and 16 in which the area percentage of the hard particles is less than 0.1(%), the delamination load is improved in other EXAMPLES having approximating conditions, This is an indication that the area percentage of the hard particles exposed on the DLC layer side surface of Cu-based bearing alloy layer is preferably 0.1(%) or greater.

(Regarding Seizure Test)

EXAMPLES 1 to 24 and COMPARATIVE EXAMPLES 1 and 2 were tested for their seizure resistance. Based on the standpoint that seizure resistance can be improved by reducing friction, reduction of friction coefficient was verified. Seizure resistance was tested, under the following conditions. The samples being tested were spun at the speed of 2 (m/sec) relative to the counter shaft and subjected, to a test load of 1 (MPa/5 min). The lubricating oil applied to the samples was SAE#30 which was supplied in the amount of 20 (ml/min) at the temperature of 60 (° C.). The counter shaft was made of carbon steel (S55C) which possessed a hardness of 600 (HV). Further, in EXAMPLE 23, a counter shaft comprising a quenched carbon steel (S55C) was used whereas, in EXAMPLES 21 and 24, a counter shaft comprising a carbon steel (S55C) with a DLC coating was used.

The specific load (MPa) in which seizure was observed in the samples is indicated in FIG. 6. Seizure was deemed to have occurred. in the samples when the temperature of the surface on the backside, that is, the opposite side of the slide surface exceeded 250 (° C.), or when the frictional force produced between the sample and the counter shaft exceeded 50 (N). According to FIG. 6, the specific load in which seizure was observed in EXAMPLES 1 to 24 was equal to or greater than 19 (MPa). In contrast, the specific load in which seizure was observed in COMPARATIVE EXAMPLES 1 and 2 was equal to or less than 11 (MPa). This is an indication that EXAMPLES 1 to 24, in which the DLC layer was formed above the DLC layer side surface of the Cu-based bearing alloy layer on which the hard particles were exposed, showed relatively greater seizuring specific load, in other words, higher seizure resistance, which in turn is an indication of relatively small friction coefficient. In particular, in EXAMPLES 1 to 6, 8, 10, 12, 15, and 17 to 24, thickness T and area percentage A of the DLC layer were controlled to a specific range. Thus, improved seizure resistance was observed in EXAMPLES 1 to 6, 8, 10, 12, 15, and 17 to 24 as compared to EXAMPLES formed in approximating conditions.

In EXAMPLES 1 to 20, 22, and COMPARATIVE EXAMPLES 1 and 2 shown in FIG. 6, the counter shaft, sliding with the samples were made of carbon steel (S55C) having a slide portion exhibiting a hardness of 600 (HV). As opposed to this, in EXAMPLES 21 and 24, the counter shaft had a DLC layer coated over the slide surface of the carbon steel (S55C). In EXAMPLE 21, the hardness of the slide portion of the counter shaft measured 5000 (HV). In EXAMPLE 24, the hardness of the slide portion of the counter shaft measured 2000 (HV). Further in EXAMPLE 23, the counter shaft comprises quenched carbon steel (S55C) and the hardness of the slide portion measured 700 (HV). Further, in EXAMPLE 20, the hardness of the slide portion of the counter shaft measured 600 (HV) while the hardness of the DLC layer measured 500 (HV). In EXAMPLE 22, the hardness of the slide portion of the counter shaft measured 600 (HV) while the hardness of the DLC layer measured 110 (HV). EXAMPLES 20 to 24 in which the hardness of the DLC layer was configured to be 0.9 times or less the hardness of the slide portion of the counter shaft showed improvement in seizuring specific load. In other words, EXAMPLES 20 to 24 in which the hardness of the DLC layer was configured to be 0.9 times or less the hardness of the slide portion of the counter shaft produced less abrasion powder as compared to EXAMPLES that do not meet this hardness condition and showed improved seizuring specific load.

(Effect of Formation Speed of DLC Layer)

EXAMPLES 1, 2, and 3 indicated in FIG. 6 form the DLC layer at different speeds. More specifically, EXAMPLE 1 forms the DLC layer shown in FIG. 3 at the first formation speed, EXAMPLE 2 forms the DLC layer shown in FIG. 4 at the second formation speed, and EXAMPLE 3 forms the DLC layer shown in FIG. 5 at the third formation speed. Further, EXAMPLES 1 to 3 have identical properties such as the Cu alloy component, hard particle component, average particle diameter of hard particles, and average distance between the hard particles. However, EXAMPLES 1 to 3 do not differ significantly in delamination load, and seizuring specific load. This is an indication that influence of the formation speed of the DLC layer on delamination load and seizuring specific load is small. Because the influence of the formation speed of the DLC layer on the properties of the slide member is small, EXAMPLES 4 to 22 and COMPARATIVE EXAMPLE 1 form the DLC layer at the second formation speed.

By forming a DLC layer on the Cu-based bearing alloy layer, EXAMPLES 1 to 24 described above allow reduction in the friction when sliding with the counter shaft. EXAMPLES 1 to 24 showed relatively higher bonding force between the Cu-based bearing alloy layer and the DLC layer as compared to COMPARATIVE EXAMPLES 1 and 2, thereby improving the seizure resistance and reducing friction at the same time.

The present embodiment may be implemented after modifications within the scope of its spirit. Though not described, each of the components may include inevitable impurities.

What is claimed is:

1. A slide member comprising:
    a Cu-based bearing alloy layer primarily comprising Cu and including hard particles; and
    a DLC layer laminated over the Cu-based bearing alloy layer;
    wherein at least some of the hard particles included in the Cu-based bearing alloy layer are exposed on a DLC layer side surface, and
    wherein the hard particles exposed on the DLC side surface are spaced from one another by an average distance ranging from 3 to 50 ($\mu$m).

2. The slide member according to claim 1, wherein the hard particles comprise at least one type of compound selected from a group consisting of boride, silicide, oxide, nitride, carbide, and intermetallic compound, and wherein the particle diameter of the hard particles averages from 0.5 to 20 ($\mu$m).

3. The slide member according to claim 2, wherein the hard particles comprise a metal silicide or a metal carbide.

4. The slide member according to claim 1, wherein the hard particles exposed on the DLC side surface occupy an area percentage ranging from 0.1(%) to 14(%).

5. The slide member according to claim 1, wherein $A \geq 0.5 \times T$,
    where A(%) represents an area percentage of the hard particles exposed on the DLC layer side surface and T($\mu$m) represents a thickness of the DLC layer.

6. The slide member according to claim 1, wherein $H \leq 10000/T$,
    where H(HV) represents a hardness of the DLC layer and T($\mu$m) represents a thickness of the DLC layer.

7. The slide member according to claim 6, wherein the DLC layer satisfies $H \leq 6000$, and $T \leq 15$.

8. The slide member according to claim 1, wherein a hardness of the DLC layer is 1.1 times or greater a hardness of the Cu-based bearing alloy layer and 0.9 times or less a hardness of a counter element with which the DLC layer slides.

* * * * *